US009083263B2

(12) United States Patent
Sato et al.

(10) Patent No.: US 9,083,263 B2
(45) Date of Patent: Jul. 14, 2015

(54) APPARATUS TO PROVIDE A TIME REFERENCE

(71) Applicant: Schlumberger Technology Corporation, Sugar Land, TX (US)

(72) Inventors: Shigeru Sato, Inagi (JP); Hideyuki Kamei, Yokohama (JP)

(73) Assignee: Schlumberger Technology Corporation, Sugar Land, TX (US)

( * ) Notice: Subject to any disclaimer, the term of this patent is extended or adjusted under 35 U.S.C. 154(b) by 16 days.

(21) Appl. No.: 13/714,237

(22) Filed: Dec. 13, 2012

(65) Prior Publication Data

US 2014/0167869 A1    Jun. 19, 2014

(51) Int. Cl.
| H03B 5/32 | (2006.01) |
| H01L 41/053 | (2006.01) |
| H01L 41/083 | (2006.01) |
| H03L 1/02 | (2006.01) |
| H03H 9/19 | (2006.01) |

(Continued)

(52) U.S. Cl.
CPC .............. *H02N 2/0005* (2013.01); *E21B 47/00* (2013.01); *H01L 41/053* (2013.01); *H01L 41/083* (2013.01); *H03B 5/32* (2013.01); *H03H 9/177* (2013.01); *H03H 9/19* (2013.01); *H03L 1/028* (2013.01)

(58) Field of Classification Search
CPC ..... H01L 41/053; H01L 41/083; H01L 41/23; H01L 41/27; H03B 5/30; H03B 5/32; H03L 1/02; H03L 1/028; H03H 3/007; H03H 3/0072; H03H 3/02; H03H 9/0215; H03H 9/02023; H03H 9/02551; H03H 9/05; H03H 9/0595; H03H 9/10; H03H 9/1035; H03H 9/105; H03H 9/1092; H03H 9/172; H03H 9/173; H03H 9/19; H03H 9/2436
USPC .................. 310/311, 315, 321, 324, 340, 344, 310/347–349, 361, 369; 331/154, 156, 158
See application file for complete search history.

(56) References Cited

U.S. PATENT DOCUMENTS 4,350,918 A * 9/1982 Sato ............................... 310/367
4,525,647 A * 6/1985 Dworsky ....................... 310/361

(Continued)

OTHER PUBLICATIONS

E.P. EerNisse, R.B. Wiggins, "Review of Thickness-Shear Mode Quartz Resonator Sensors for Temperature and Pressure," IEEE Sensors Journal, vol. 1, No. 1, Jun. 2001, pp. 79-87.

(Continued)

*Primary Examiner* — Levi Gannon
(74) *Attorney, Agent, or Firm* — Daryl R. Wright; Jody DeStefanis

(57) ABSTRACT

Apparatus to provide a time reference are disclosed herein. An example apparatus disclosed herein includes a resonator. A first cap is coupled to a first side of the resonator to define a first cavity, and a second cap is coupled to a second side of the resonator to define a second cavity. The first cavity and the second cavity provide a first vacuum in which the resonator is to resonate. The resonator, the first cap and the second cap have substantially identical thermal expansion coefficients. The example apparatus also includes a vacuum chamber surrounding the resonator, the first cap and the second cap. The vacuum chamber is to provide a second vacuum in which the resonator, the first cap and the second cap are disposed. A frequency of resonance of the resonator in the first vacuum is to provide a time reference.

9 Claims, 6 Drawing Sheets

(51) Int. Cl.
*H02N 2/00* (2006.01)
*H03H 9/17* (2006.01)
*E21B 47/00* (2012.01)

(56) References Cited

U.S. PATENT DOCUMENTS

| | | | | |
|---|---|---|---|---|
| 4,705,982 | A | * | 11/1987 | Besson et al. ................ 310/356 |
| 5,006,750 | A | * | 4/1991 | Besson et al. ................ 310/348 |
| 5,304,887 | A | * | 4/1994 | Heinecke et al. ............ 310/361 |
| 5,394,345 | A | | 2/1995 | Berard et al. |
| 5,589,724 | A | * | 12/1996 | Satoh et al. .................. 310/348 |
| 6,049,256 | A | * | 4/2000 | Fry ................................ 331/69 |
| 7,173,499 | B2 | * | 2/2007 | Satoh ........................... 331/158 |
| 7,334,483 | B2 | | 2/2008 | Sato et al. |
| 8,069,549 | B2 | * | 12/2011 | Nagano et al. ................. 29/594 |
| 8,179,023 | B2 | * | 5/2012 | Takahashi .................... 310/348 |
| 8,294,332 | B2 | | 10/2012 | Matsumoto et al. |

OTHER PUBLICATIONS

P. Breton et al., "Well Positioned Seismic Measurements," Oilfield Review, pp. 32-45, Spring, 2002.

* cited by examiner

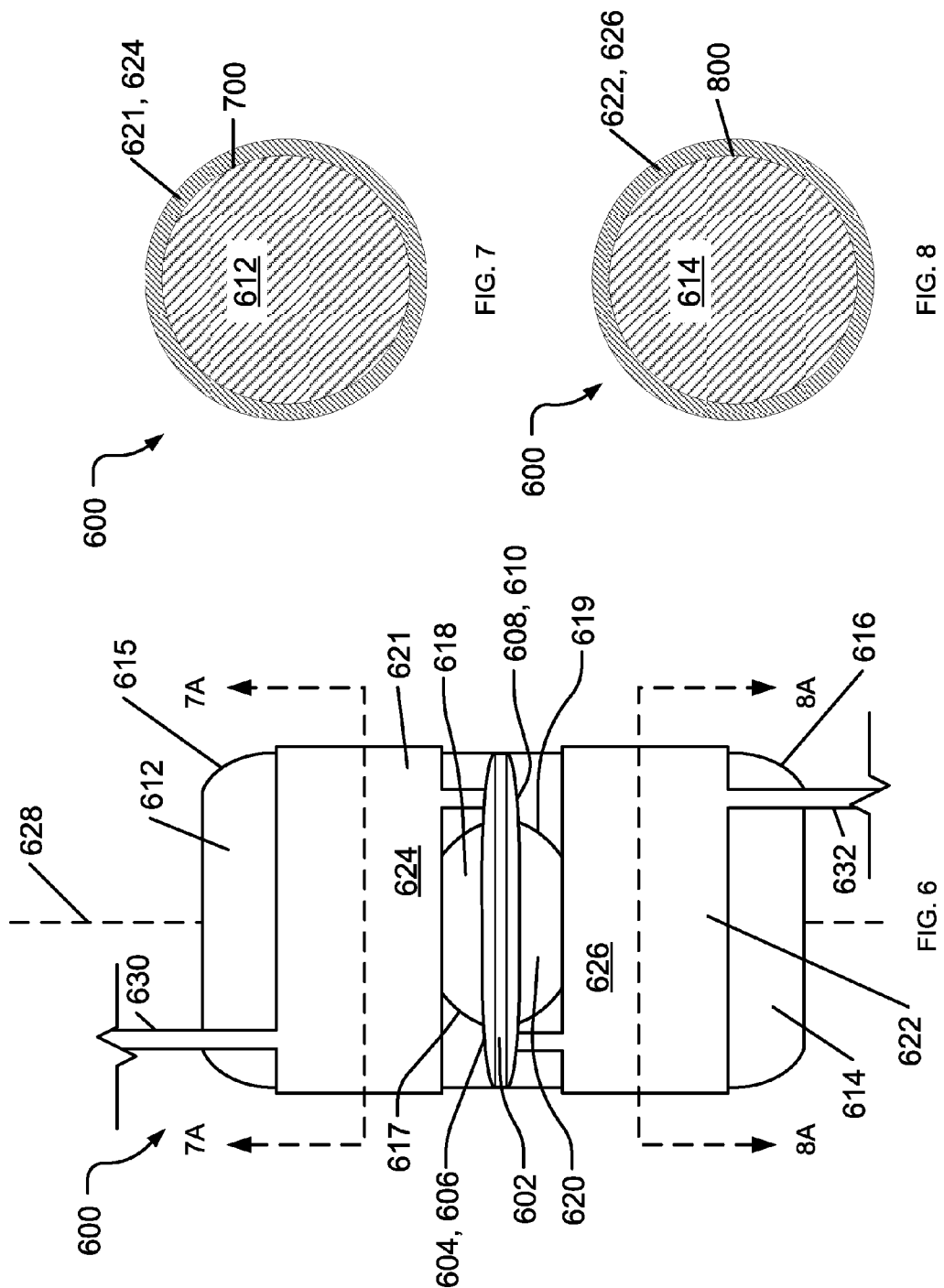

APPARATUS TO PROVIDE A TIME REFERENCE

BACKGROUND OF THE DISCLOSURE

A resonator is often used in a clock. Generally, when an electric current passes through the resonator, the resonator resonates at a given frequency. Cycles of an oscillatory signal generated by the resonator may be counted to provide a time reference.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An example apparatus disclosed herein includes a resonator. A first cap is coupled to a first side of the resonator to define a first cavity, and a second cap is coupled to a second side of the resonator to define a second cavity. The first cavity and the second cavity provide a first vacuum in which the resonator is to resonate. The resonator, the first cap and the second cap have substantially identical thermal expansion coefficients. The example apparatus also includes a vacuum chamber surrounding the resonator, the first cap and the second cap. The vacuum chamber is to provide a second vacuum in which the resonator, the first cap and the second cap are disposed. A frequency of resonance of the resonator in the first vacuum is to provide a time reference.

Another example apparatus disclosed herein includes a clock having a first crystal cap, a second crystal cap and a crystal resonator. The crystal resonator is disposed in a first vacuum between the first crystal cap and the second crystal cap. The crystal resonator, the first crystal cap and the second crystal cap have substantially identical crystal orientations and coefficients of thermal expansion. The example apparatus also includes a vacuum chamber. The clock is disposed inside the vacuum chamber in a second vacuum.

Another example apparatus disclosed herein includes a clock to be disposed in first vacuum of a vacuum chamber. The clock includes a first quartz layer, a second quartz layer and a third quartz layer. A portion of the second quartz layer is disposed in a second vacuum between the first quartz layer and the third quartz layer, and a frequency of resonance of the second quartz layer is to provide a time reference.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 6 illustrates various components of another example device that can implement embodiments of apparatus to provide a time reference.

FIG. 7 illustrates various components of the example device of FIG. 6 that can implement embodiments of apparatus to provide a time reference.

FIG. 8 illustrates various components of the example device of FIG. 6 that can implement embodiments of apparatus to provide a time reference.

DETAILED DESCRIPTION

Figure 1:
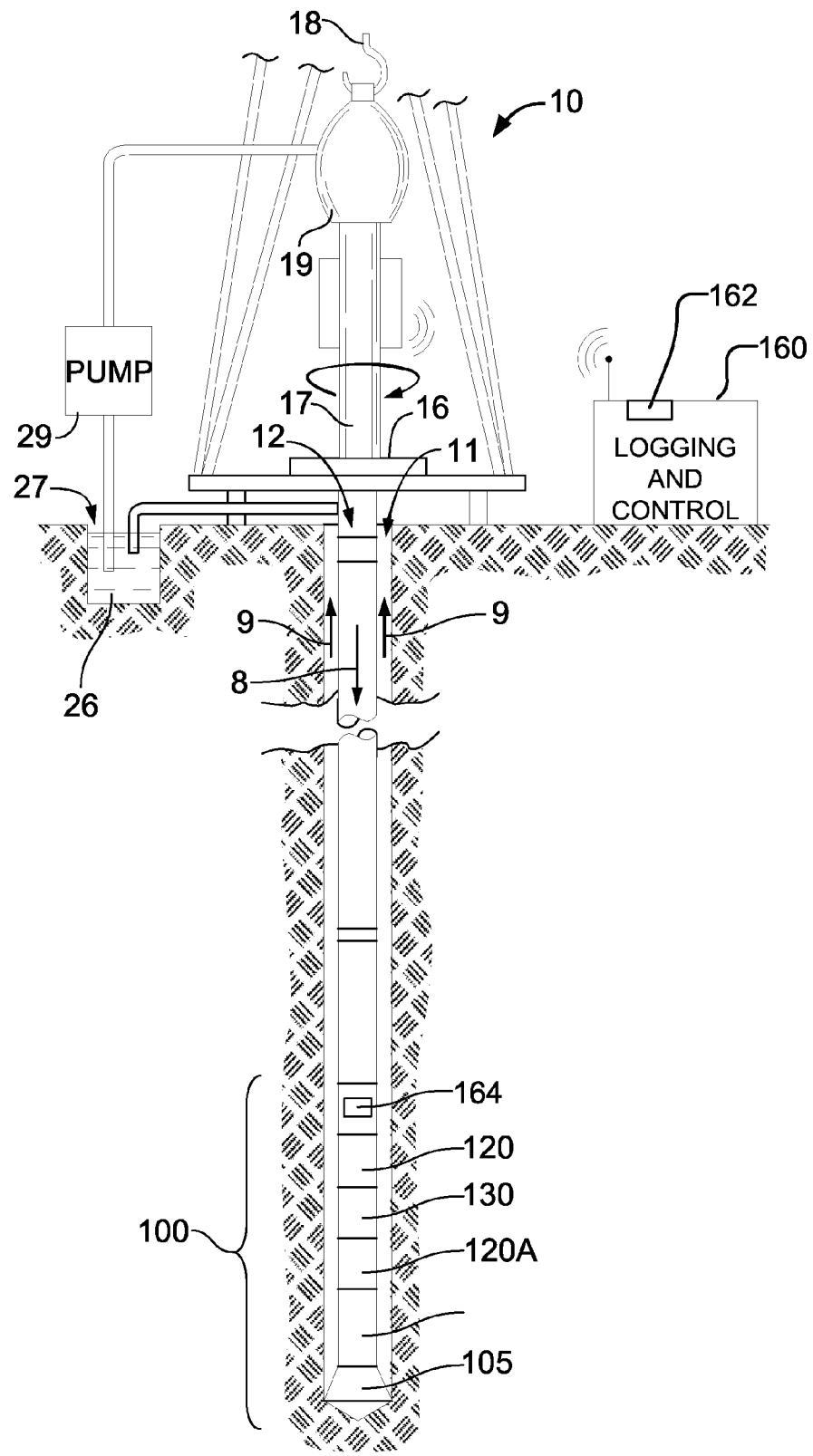
FIG. 1 illustrates an example system in which embodiments of apparatus to provide a time reference can be implemented.

It is to be understood that the following disclosure provides many different embodiments or examples for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of implicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features such that the first and second features may not be in direct contact.

One or more aspects of the present disclosure relate to apparatus to provide a time reference. An example clock disclosed herein may include a quartz crystal resonator disposed between and coupled to a first cap and a second cap. In some examples, the resonator is disk-shaped and the first cap and the second cap are substantially cylinder-shaped. The first cap may be substantially symmetric relative to the second cap. As a result, the example clock may be substantially cylinder-shaped such that heat flows symmetrically into the resonator. In some examples, the first cap and second cap each define a cavity in which a portion of the resonator may be disposed. In some examples, the cavities provide a vacuum in which the resonator is to vibrate without resistance from air (e.g., without friction between air and the resonator).

In some examples, the first cap and the second cap are quartz crystals. Thus, the clock may include a first quartz layer, a second quartz layer and a third quartz layer having substantially similar coefficients of thermal expansion and/or crystal orientations. In some examples, the clock is disposed inside a vacuum chamber to substantially isolate the clock from environmental pressures and/or temperatures. A frequency of resonance of the resonator in the vacuum may provide a time reference for one or more electronic components (e.g., a transmitter, a receiver, an integrated circuit, etc.).

FIG. 1 illustrates a wellsite system in which the examples disclosed herein can be employed. The wellsite can be onshore or offshore. In this example system, a borehole 11 is formed in subsurface formations by rotary drilling in a manner that is well known. Examples can also use directional drilling, as will be described hereinafter.

A drill string 12 is suspended within the borehole 11 and has a bottom hole assembly 100 which includes a drill bit 105 at its lower end. The surface system includes platform and derrick assembly 10 positioned over the borehole or wellbore 11, the assembly 10 including a rotary table 16, kelly 17, hook 18 and rotary swivel 19. The drill string 12 is rotated by the rotary table 16, energized by means not shown, which engages the kelly 17 at the upper end of the drill string 12. The drill string 12 is suspended from the hook 18, attached to a traveling block (also not shown), through the kelly 17 and the rotary swivel 19, which permits rotation of the drill string 12 relative to the hook 18. As is well known, a top drive system could be used.

In the illustrated example, the surface system further includes drilling fluid or mud 26 stored in a pit 27 formed at the well site. A pump 29 delivers the drilling fluid 26 to the interior of the drill string 12 via a port in the swivel 19, causing the drilling fluid 26 to flow downwardly through the drill string 12 as indicated by the directional arrow 8. The drilling fluid 26 exits the drill string 12 via ports in the drill bit 105, and then circulates upwardly through the annulus region between the outside of the drill string 12 and the wall of the borehole 11, as indicated by the directional arrows 9. In this well-known manner, the drilling fluid 26 lubricates the drill bit 105 and carries formation cuttings up to the surface as it is returned to the pit 27 for recirculation.

The bottom hole assembly 100 of the illustrated embodiment includes a logging-while-drilling (LWD) module 120, one or more measuring-while-drilling (MWD) module 130, a roto-steerable system and motor, and drill bit 105.

The LWD module 120 is housed in a special type of drill collar, as is known in the art, and can contain one or a plurality of known types of logging tools. It will also be understood that more than one LWD and/or MWD module can be employed, e.g. as represented at 120A. References throughout to a module at the position of 120 can mean a module at the position of 120A as well. The LWD module includes capabilities for measuring (e.g., information acquiring devices), processing, and storing information (e.g., an information storage device such as, for example, nonvolatile memory), as well as for communicating with the surface equipment such as for example, a logging and control unit 160. In the illustrated example, the logging and control unit 160 includes an uphole clock 162. The bottom hole assembly 100 includes a downhole clock 164. Before the example LWD tool 120 is lowered into the borehole 11, the downhole clock 164 is synchronized with the uphole clock 162. In the illustrated example, the LWD module 120 includes a seismic measuring device.

The MWD module 130 is also housed in a special type of drill collar, as is known in the art, and can contain one or more devices for measuring characteristics of the drill string 12 and drill bit 105. The MWD tool further includes an apparatus (not shown) for measuring characteristics of the drill string and drill bit. The MWD tool further includes an apparatus (not shown) for generating electrical power to the downhole system. This may include a mud turbine generator powered by the flow of the drilling fluid, it being understood that other power and/or battery systems may be employed. In the present embodiment, the MWD module includes one or more of the following types of measuring devices: a weight-on-bit measuring device, a torque measuring device, a vibration measuring device, a shock measuring device, a stick slip measuring device, a direction measuring device, and an inclination measuring device. The downhole clock 164 may provide a time reference for one or more of the measuring devices.

Figure 2A:
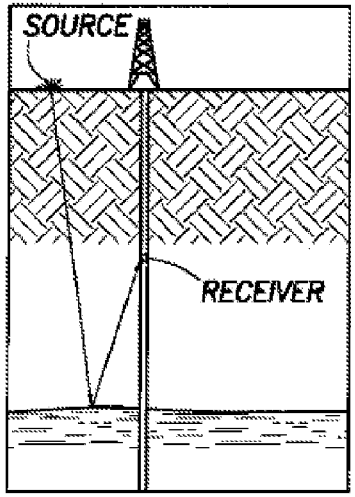
FIGS. 2A-2D illustrate other example systems in which embodiments of example apparatus to provide a time reference can be implemented.
Figure 2B:
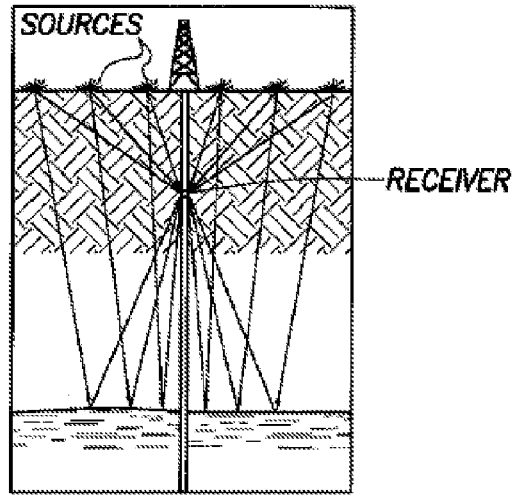
Figure 2C:
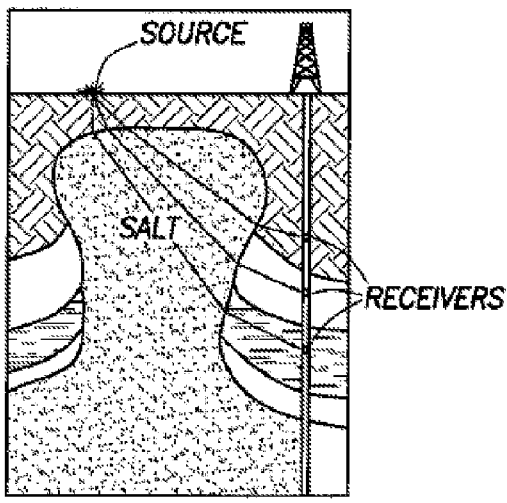
Figure 2D:
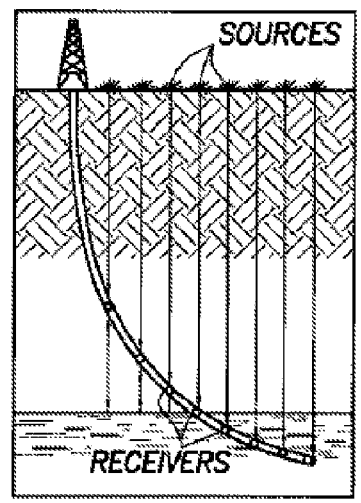

FIGS. 2A-2D illustrate seismic-while-drilling tools that can be the LWD tool 120, or can be a part of an LWD tool suite 120A of the type disclosed in P. Breton et al., "Well Positioned Seismic Measurements," Oilfield Review, pp. 32-45, Spring, 2002, incorporated herein by reference. The downhole LWD tool can have a single receiver (as depicted in FIGS. 2A and 2B), or plural receivers (as depicted in FIGS. 2C and 2D), and can be employed in conjunction with a single seismic source at the surface (as depicted in FIGS. 2A and 2C) or plural seismic sources at the surface (as depicted in FIGS. 2B and 2D). Accordingly, FIG. 2A, which includes reflection off a bed boundary, and is called a "zero-offset" vertical seismic profile arrangement, uses a single source and a single receiver, FIG. 2B, which includes reflections off a bed boundary, and is called a "walkaway" vertical seismic profile arrangement, uses plural sources and a single receiver, FIG. 2C, which includes refraction through salt dome boundaries, and is called a "salt proximity" vertical seismic profile, uses a single source and plural receivers, and FIG. 2D, which includes some reflections off a bed boundary, and is called a "walk above" vertical seismic profile, uses plural sources and plural receivers. In some examples, the downhole clock 164 provides a time reference for one or more of the receivers.

Figure 3:
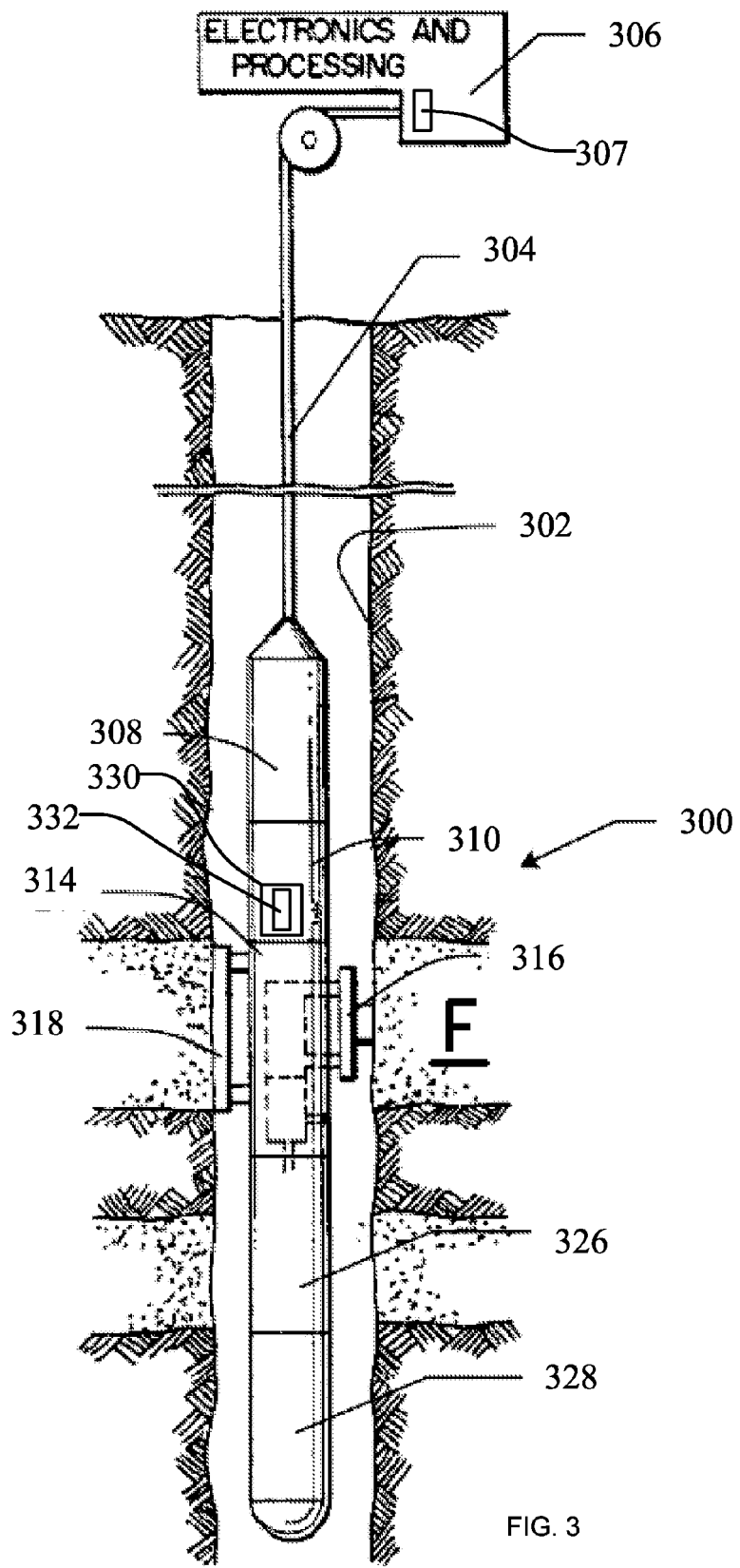
FIG. 3 illustrates another example system in which embodiments of example apparatus to provide a time reference can be implemented.

FIG. 3 is an example wireline tool 300 that may be another environment in which aspects of the present disclosure may be implemented. The example wireline tool 300 is suspended in a wellbore 302 from the lower end of a multiconductor cable 304 that is spooled on a winch (not shown) at the Earth's surface. At the surface, the cable 304 is communicatively coupled to an electronics and processing system 306, which includes an uphole clock 307. The example wireline tool 300 includes an elongated body 308 that includes a formation tester 314 having a selectively extendable probe assembly 316 and a selectively extendable tool anchoring member 318 that are arranged on opposite sides of the elongated body 308. Additional components (e.g., 310) may also be included in the tool 300.

The extendable probe assembly 316 may be configured to selectively seal off or isolate selected portions of the wall of the wellbore 302 to fluidly couple to an adjacent formation F and/or to draw fluid samples from the formation F. Accordingly, the extendable probe assembly 316 may be provided with a probe having an embedded plate, as described above. The formation fluid may be expelled through a port (not shown) or it may be sent to one or more fluid collecting chambers 326 and 328. In the illustrated example, the electronics and processing system 306 and/or a downhole control system 330 are configured to control the extendable probe assembly 316 and/or the drawing of a fluid sample from the formation F. In the illustrated example, the downhole control system 330 includes a downhole clock 332 to provide a time reference for the downhole control system 330 and/or one or more electronic components of the wireline tool 300. The downhole clock 332 may be synchronized with the uphole clock 307 of the electronics and processing unit 306 before the downhole clock 332 is disposed downhole.

During downhole operation, the uphole clock 307 and the downhole clock 332 are not in communication. As a result, the downhole clock 332 may not rely on the uphole clock 332 to maintain a time reference. If the uphole clock 332 and the downhole clock 332 are not in sync during operation, seismic transit time measurement errors may occur. Therefore, the example downhole clock 332 maintains the time reference while disposed downhole. In some examples, the downhole clock 332 is exposed to severe environmental mechanical shocks and vibration during drilling operations and/or other downhole operations.

Figure 4:
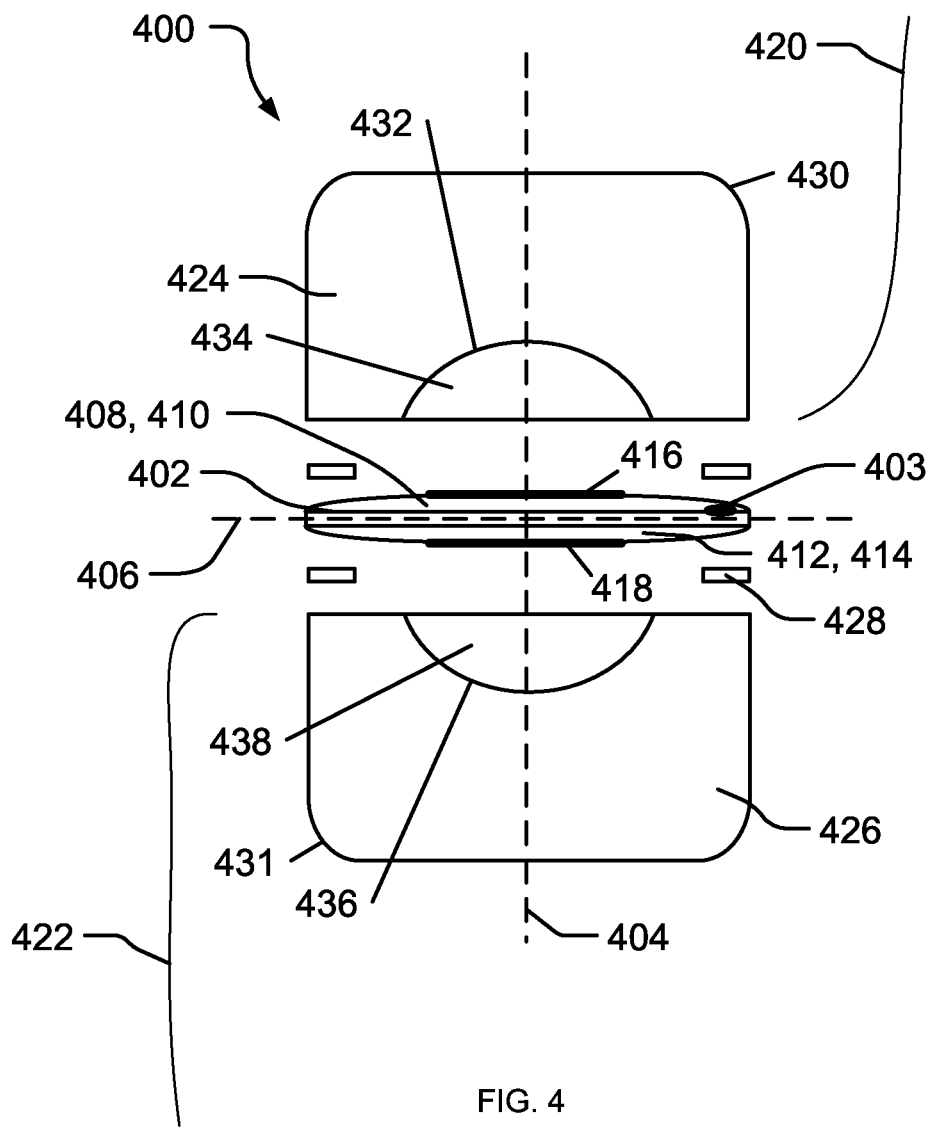
FIG. 4 illustrates various components of an example device that can implement embodiments of apparatus to provide a time reference.

FIG. 4 is an exploded view of an example clock 400 disclosed herein, which may be used to implement the downhole clock 164 of FIG. 1, the downhole clock 332 of FIG. 3, and/or any other downhole clock. The example clock 400 of FIG. 4 may also be used to implement the uphole clock 162 of FIG. 1, the uphole clock 307 of FIG. 3 and/or any other clock. In the illustrated example, the clock 400 includes a resonator 402. The example resonator 402 of FIG. 4 is a dual-mode resonator. In some examples, the resonator 402 is a single-mode resonator and includes a temperature sensor 403 (e.g., a platinum, thin film resistance thermometer, a resistance temperature detector, etc.) to determine a temperature of the resonator 402. In some examples, the temperature sensor 403 is disposed on the resonator 402 adjacent an edge of the resonator 402. During operation of the example clock 400, a frequency of resonance of the resonator 402 is to provide a time reference for one or more electronic components such as, for example, a transmitter, an integrated circuit, a receiver, etc.

In the illustrated example, the example resonator 402 of FIG. 4 is cylindrically symmetric. For example, the resonator 402 may be substantially symmetric relative to a first plane 404 and a second plane 406 intersecting a center of the resonator 402. In the illustrated example, the first plane 404 is vertical in the orientation of FIG. 4, and the second plane 406 is horizontal in the orientation of FIG. 4. In the illustrated example, the resonator 402 has a bi-convex shape (i.e., a first side 408 of the resonator 402 defines a rounded, convex first surface 410, and a second side 412 of the resonator 402 defines a rounded, convex second surface 414). In other examples, the resonator 402 is other shapes such as, for example, substantially disk-shaped, plano-convex (e.g., semi-spherical, etc.), any resonator shape described in U.S. Pat. No. 8,294,332, filed Jul. 2, 2007, entitled "Pressure Transducer," to Matsumoto et al., the disclosure of which is hereby incorporated by reference herein in its entirety, and/or any other suitable shape.

The resonator 402 may be composed of a piezoelectric material. In the illustrated example, the resonator 402 is a quartz crystal having a first crystal orientation (e.g., SBTC, AT, BT, X, SC, IT, etc). In other examples, the resonator 402 is composed of other materials.

In the illustrated example, a first electrode 416 is coupled (e.g., deposited, coated, etc.) to the first side 408 of the resonator 402. A second electrode 418 is coupled to the second side 412 of the example resonator 402. In the illustrated example, the first electrode 416 is substantially symmetric relative to the second electrode 418. The first electrode 416 and the second electrode 418 may be composed of gold and/or any other suitable material(s). The first electrode 416 and the second electrode 418 may be coupled to oscillator electronics via one or more wires 420 and 422.

The example resonator 402 of FIG. 4 is disposed between a first cap 424 and a second cap 426. The first cap 424 and the second cap 426 are symmetrically disposed relative to the resonator 402. In the illustrated example, the first side 408 of the resonator 402 is coupled to the first cap 424. A second side 412 of the example resonator 402 is coupled to the second cap 426. The first cap 424 and the second cap 426 may be coupled to the resonator 402 via any suitable technique. In the illustrated example, the resonator 402 is coupled to the first cap 424 and the second cap 426 via frit 428 (e.g., glass frit). The example first cap 424 and the example second cap 426 have substantially similar or identical shapes. Thus, in the illustrated example, the first cap 424 is substantially symmetric relative to the second cap 426. In the illustrated example, the first cap 424 and the second cap 426 are substantially cylindrical with rounded outer edges 430 and 431. In other examples, the first cap 424 and/or the second cap 426 are other shapes.

The example first cap 424 of FIG. 4 defines a first recess or cavity 432 adjacent the first side 408 of resonator 402. In the illustrated example, the first cavity 432 is semi-spherical. In other examples, the first cavity 432 is other shapes such as, for example, concave, cylindrical, hexahedral, etc. In some examples, the first cap 424 is spaced apart from a portion of the first side 408 of the resonator 402 via the frit 428, and a space between the resonator 402 and the first cap 424 provides the first cavity 432. In the illustrated example, the first electrode 416 is disposed in the first cavity 432. In some examples, the first cavity 432 provides a first vacuum 434 to enable the resonator 402 to resonate in the first cavity 432 without being subjected to resistance from air (e.g., friction between the air and the resonator 402) and/or other fluids.

The example second cap 426 defines a second recess or cavity 436 adjacent the second side 412 of resonator 402. In the illustrated example, the second cavity 436 is semi-spherical. In other examples, the second cavity 436 is other shapes such as, for example, concave, cylindrical, rectangular, etc. The example second cavity 436 is symmetric relative to the example first cavity 432. In the illustrated example, the second electrode 418 is disposed in the second cavity 436. In some examples, the second cap 426 is spaced apart from a portion of the second side 412 of the resonator 402 via the frit 428, and a space between the resonator 402 and the second cap 426 provides the second cavity 436. In some examples, the second cavity 436 provides a second vacuum 438 to enable the resonator 402 to resonate in the second cavity 436 without being subjected to resistance from air (e.g., friction between the air and the resonator 402) and/or other fluids. Thus, the resonator 402 is substantially disposed the first vacuum 434 and the second vacuum 438 provided within the example clock 402.

In the illustrated example, the first cap 424 and the second cap 426 are quartz crystals. Thus, the first cap 424, the resonator 402 and the second cap 426 form a first quartz layer, a second quartz layer and a third quartz layer, respectively. Other examples may be composed of other materials. The example first cap 424 has a second crystal orientation (e.g., SBTC, AT, BT, X, SC, IT, etc.). The example second cap 426 has a third crystal orientation (e.g., SBTC, AT, BT, X, SC, IT, etc.). In the illustrated example, the first crystal orientation of the resonator 402, the second crystal orientation of the first cap 424, and the third crystal orientation of the second cap 426 are substantially similar or identical.

The resonator 402 has a coefficient of thermal expansion substantially similar or identical to coefficients of thermal expansion of the first cap 424 and the second cap 426. In the illustrated example, the frit 428 also has a substantially similar thermal expansion coefficient to that of the resonator 402, the first cap 424 and the second cap 426.

Thus, during operation of the example clock 400, thermal distortion (e.g., thermal expansion and/or shrinkage) of the first cap 424, the frit 428 and/or the second cap 426 is substantially the same as thermal distortion (e.g., thermal expansion and/or shrinkage) of the resonator 402. As a result, thermal distortion of the clock 400 produces substantially no mechanical stress in the resonator 402 at stable (constant) temperatures or thermal equilibrium conditions.

Figure 5:
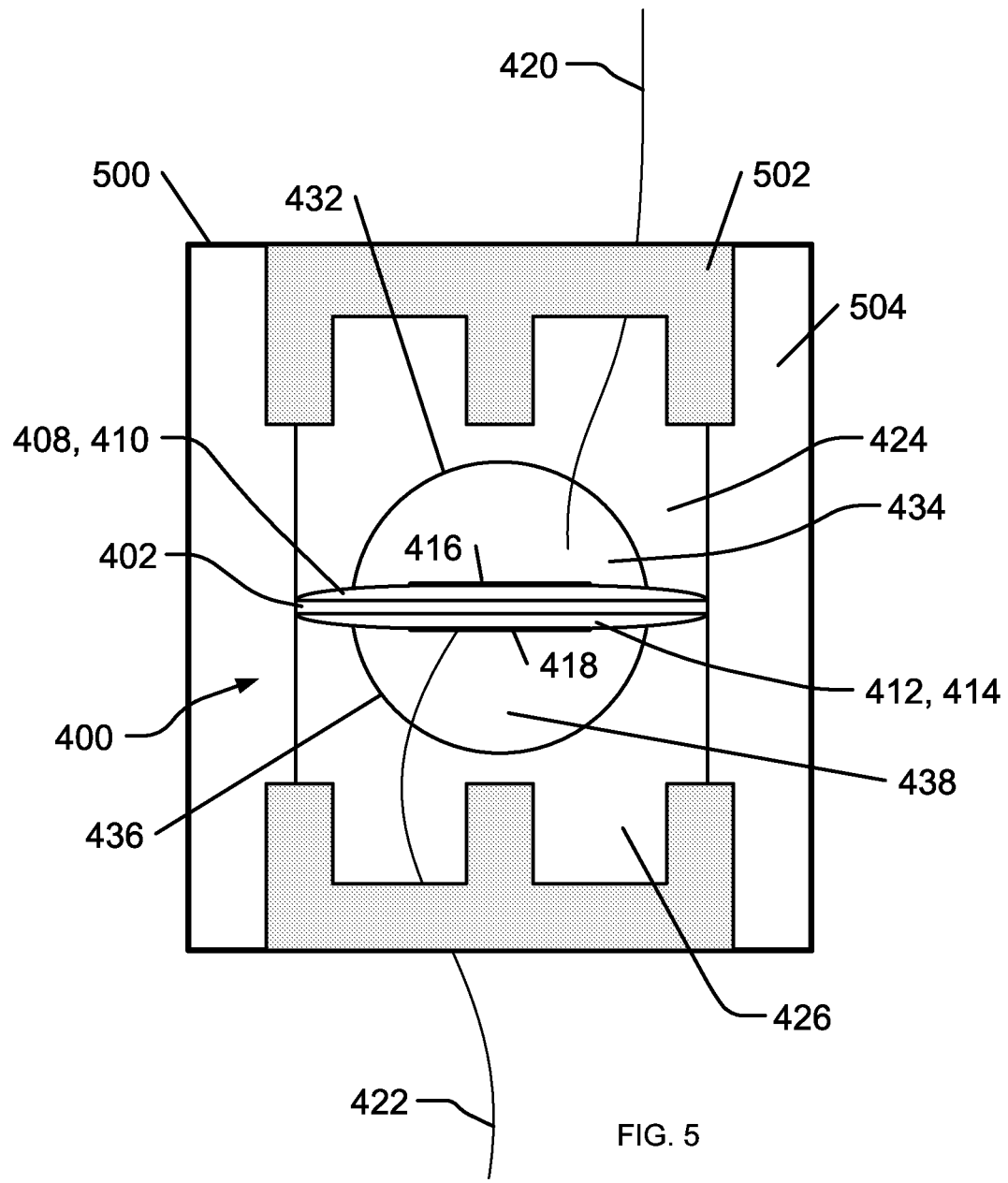
FIG. 5 illustrates various components of an example device that can implement embodiments of apparatus to provide a time reference.

FIG. 5 illustrates the example clock 400 of FIG. 4 disposed inside a vacuum chamber 500. The example vacuum chamber 500 surrounds the resonator 402, the first cap 424 and the second cap 426. In the illustrated example, the clock 400 is coupled to the vacuum chamber 500 via a support 502. The example support 502 of FIG. 5 substantially holds the clock 400 in place relative to the vacuum chamber 500 via the first cap 424 and the second cap 426. In some examples, the support 502 is composed of a thermally insulating material (e.g., one or more materials having a low thermal conductivity) such as, for example, plastic (e.g., Teflon™, polyetheretherkeytone (PEEK), etc.). The example vacuum chamber 500 provides a second vacuum 504 in which the clock 400 is substantially isolated from temperature and/or pressure changes outside of the vacuum chamber 500. Thus, the vacuum chamber 500 provides the second vacuum 504 in which the clock 400 is disposed, and the clock 400 provides the first vacuum 434 and the second vacuum 438 in which the resonator 402 is disposed and resonates. A frequency of resonance of the resonator 402 in the first vacuum 434 and the second vacuum 438 provides a time reference for one or more electronic components. The time reference may include a count of cycles of an oscillatory signal generated by the resonator 402.

The example clock 400 of FIGS. 4-5 may be calibrated statically and/or dynamically for temperature. To statically calibrate the example clock 400, a relationship between a temperature and a frequency of the resonator 402 is determined. The relationship may be determined by subjecting the example clock 400 to a variety of substantially constant temperatures. At each of the temperatures, a frequency of resonance of the resonator 402 is measured. A mathematical model (e.g., a fitting polynomial, etc.) approximating the relationship may be generated based on the frequencies and the temperatures. In some examples, compensation parameters or correction terms are determined based on the relationship, which may be used to determine the time reference.

If the example clock 400 is to be disposed to varying temperature conditions, dynamic calibration may be performed to enable the time reference to take into account frequency errors due to thermal stress. To dynamically calibrate the example clock 400, a frequency of the resonator 402 and a temperature of the resonator 402 are determined as the temperature of the resonator 402 is changed. Based on a plot of a frequency error of resonance of the resonator 402 and a time derivative of the temperature, a compensation parameter or correction term (e.g., a constant proportional to the time derivative of the temperature) is determined, which may be used to update the time reference to take into account a frequency error. If the resonator 402 is a dual-mode resonator, the temperature of the clock 400 may be determined based on two output frequencies of the resonator 402. If the resonator 402 is a single-mode resonator, a temperature sensor (e.g., a resistance temperature detector) may determine a temperature of the resonator 402. The second vacuum 504 enables a temperature gradient of the resonator 402 to be substantially constant. As a result, dynamic frequency errors may be corrected with an analytical thermal stress model.

FIG. 6 illustrates another example clock 600 disclosed herein, which may be used to implement the downhole clock 164 of FIG. 1, the downhole clock 332 of FIG. 3, and/or any other downhole clock. The example clock 600 may also be used to implement the uphole clock 162 of FIG. 1, the uphole clock 307 of FIG. 3, and/or any other uphole clock. In the illustrated example, the clock 600 includes a resonator 602 (e.g., a dual-mode resonator, a single-mode resonator, etc.). The resonator 602 may be composed of a piezoelectric material. In the illustrated example, the resonator 602 is a quartz crystal having a first crystal orientation (e.g., SBTC, AT, BT, X, SC, IT, etc). In other examples, the resonator 602 is composed of other materials.

In the illustrated example, the resonator 602 is a bi-convex shape (i.e., a first side 604 of the resonator 602 defines a rounded, convex first surface 606, and a second side 608 of the resonator 602 defines a rounded, convex second surface 610), a plano-convex shape (e.g., semi-spherical, etc.), and/or any other suitable shape.

The example resonator 602 of FIG. 6 is disposed between a first cap 612 and a second cap 614. The first cap 612 and the second cap 614 are symmetric relative to the resonator 602. In the illustrated example, the first side 608 of the resonator 602 is coupled to the first cap 612. A second side 610 of the example resonator 602 is coupled to the second cap 614. In some examples, the resonator 602 is coupled to the first cap 612 and the second cap 614 via frit (e.g., glass frit) and/or via any other suitable technique. The example first cap 612 and the example second cap 614 have substantially similar or identical shapes. Thus, in the illustrated example, the first cap 612 is substantially symmetric relative to the second cap 614. In the illustrated example, the first cap 612 and the second cap 614 are substantially cylindrical with rounded outer edges 615 and 616. The example first cap 612 and the example second cap 614 have diameters about equal to a diameter of the resonator 602. Thus, the clock 600 of FIG. 6 is substantially cylindrical. In other examples, the first cap 612 and/or the second cap 614 are other shapes.

The example first cap 612 of FIG. 6 defines a first recess or cavity 617 adjacent the first side 604 of resonator 602. In the illustrated example, the first cavity 617 is semi-spherical. In other examples, the first cavity 617 is other shapes such as, for example, concave, cylindrical, hexahedral, etc. In some examples, the first cap 612 is spaced apart from a portion of the first side 604 of the resonator 602 via the frit, and a space between the resonator 602 and the first cap 612 provides the first cavity 617. In some examples, the first cavity 617 provides a first vacuum 618 to enable the resonator 602 to resonate in the first cavity 617 without being subjected to resistance from air (e.g., friction between the air and the resonator 602) and/or other fluids.

The example second cap 614 defines a second recess or cavity 619 adjacent the second side 610 of resonator 602. In the illustrated example, the second cavity 619 is semi-spherical. In other examples, the second cavity 619 is other shapes such as, for example, concave, cylindrical, rectangular, etc. The example second cavity 619 is symmetric relative to the example first cavity 617. In some examples, the second cap 614 is spaced apart from a portion of the second side 610 of the resonator 602 via the frit, and a space between the resonator 602 and the second cap 614 provides the second cavity 619. In some examples, the the second cavity 619 provides a second vacuum 620 to enable the resonator 602 to resonate in the second cavity 619 without being subjected to resistance from air (e.g., friction between the air and the resonator 602) and/or other fluids. Thus, the resonator 602 is substantially disposed the first vacuum 618 and the second vacuum 620 maintained within the example clock 600.

A first electrode 621 is coupled to the first cap 612 and the resonator 602. A second electrode 622 is coupled to the second cap 614 and the resonator 602. As described in greater detail below, a first portion 624 of the first electrode 621 and a second portion 626 of the second electrode 622 are substantially ring-shaped.

In the illustrated example, the first cap 612 and the second cap 614 of FIG. 1 are quartz crystals. Thus, the first cap 612, the resonator 602 and the second cap 614 form a first quartz layer, a second quartz layer and a third quartz layer, respectively. Other example clocks may be composed other types of crystals. The example first cap 612 has a second crystal orientation (e.g., SBTC, AT, BT, X, SC, IT, etc.). The example second cap 614 has a third crystal orientation (e.g., SBTC, AT, BT, X, SC, IT, etc.). In the illustrated example, the first crystal orientation of the resonator 602, the second crystal orientation of the first cap 612, and the third crystal orientation of the second cap 614 are substantially similar or identical.

The example resonator 602 of FIG. 6 has a coefficient of thermal expansion substantially similar or identical to coefficients of thermal expansion of the first cap 612 and the second cap 614. Thus, during operation of the example clock 600, thermal expansion and/or shrinkage of the first cap 612 and/or the second cap 614 is substantially the same as thermal expansion and/or shrinkage of the resonator 602. As a result, thermal expansion and shrinkage of the clock 600 produces substantially no mechanical stress in the resonator 602 at stable (constant) temperatures or thermal equilibrium conditions.

FIGS. 7 and 8 are cross-sectional views along lines 7A and 8A, respectively. FIG. 7 is a cross-sectional view of the first cap 612 and the first electrode 621. In the illustrated example of FIG. 7, the first portion 624 of the first electrode 621 is ring-shaped and is disposed (e.g., deposited) on a circumferential, first surface 700 of the first cap 612. Thus, the first portion 624 of the first electrode 621 surrounds the first cap 612.

FIG. 8 is a cross-sectional view of the second cap 614 and the second electrode 622. The second electrode 622 is coupled to the second cap 614 and the resonator 602. In the illustrated example, the second portion 626 of the second electrode 622 is ring-shaped and disposed on a circumferential, second surface 800 of the second cap 614. Thus, the second portion 626 of the second electrode 622 surrounds the second cap 614. In the illustrated example, the first electrode 621 is substantially symmetric relative to the second electrode 622. Thus, the example first and second electrodes 621 and 622 enable heat propagation paths through the first and second electrodes 621 and 622 to be cylindrically-shaped and symmetric relative to a longitudinal axis 628 of the example clock 600. The first electrode 621 and the second electrode 622 may be composed of gold and/or any other suitable material(s). The first electrode 621 and the second electrode 622 may be coupled to one or more electronic components such as, for example, an oscillator electronics, via one or more wires 630 and 632.

In some examples, the clock 600 of FIGS. 6-8 is disposed inside a vacuum chamber such as, for example, the vacuum chamber 500 of FIG. 5. The clock 600 may be coupled to the vacuum chamber via a thermally insulating support such as, for example, the support 502 of FIG. 5. During operation of the example clock 600, an electric current is provided to the resonator 602 via one or both of the first electrode 621 and the second electrode 622 to resonate the resonator 602 at one or two given frequencies in the first vacuum 618 and the second vacuum 620. The frequency(ies) may be used to provide a time reference for one or more electronics such as, for example, a transmitter, a receiver, an integrated circuit, etc. Thus, the vacuum chamber maintains a third vacuum in which the clock 600 is disposed, and the clock 600 maintains the first vacuum 618 and the second vacuum 620 in which the resonator 602 is disposed and resonates.

Although only a few example embodiments have been described in detail above, those skilled in the art will readily appreciate that many modifications are possible in the example embodiments without materially departing from apparatus to provide a time reference. Accordingly, such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. §112, paragraph 6 for any limitations of any of the claims herein, except for those in which the claim expressly uses the words 'means for' together with an associated function.

The Abstract at the end of this disclosure is provided to comply with 37 C.F.R. §1.72(b) to allow the reader to quickly ascertain the nature of the technical disclosure. It is submitted with the understanding that it will not be used to interpret or limit the scope or meaning of the claims.

What is claimed is:

1. An apparatus, comprising:
   a resonator;
   a first cap coupled to a first side of the resonator to define a first cavity;
   a second cap coupled to a second side of the resonator to define a second cavity, the resonator, the first cap and the second cap having substantially identical thermal expansion coefficients, wherein the first cavity and the second cavity provide a first vacuum in which the resonator is to resonate;
   a vacuum chamber surrounding the resonator, the first cap and the second cap, the vacuum chamber to provide a second vacuum in which the resonator, the first cap and the second cap are disposed, wherein the resonator is a dual-mode resonator, wherein a frequency of resonance of the resonator in the first vacuum and the second vacuum is to provide a time reference for dynamic calibration using an analytical thermal stress model, wherein the first cap, the second cap and the resonator have substantially identical crystal orientations;
   and
   a first electrode and a second electrode, a first portion of the first electrode substantially ring-shaped and disposed on a first circumferential surface of the first cap, a second portion of the second electrode substantially ring-shaped and disposed on a second circumferential surface of the second cap, wherein the first electrode and the second electrode are cylindrically shaped and symmetric relative to a longitudinal axis of the apparatus for enabling heat propagation paths through the first electrode and the second electrode.

2. The apparatus of claim 1 further comprising a thermally insulating support, wherein the first cap, the second cap and the resonator are coupled to the vacuum chamber via the support.

3. The apparatus of claim 1 wherein the first cap, the second cap and the resonator are composed of quartz.

4. The apparatus of claim 1 wherein the first cap and the second cap have substantially identical shapes.

5. An apparatus, comprising:
   a clock including a first crystal cap, a second crystal cap and a crystal resonator, a portion of the crystal resonator disposed in a first vacuum between the first crystal cap and the second crystal cap, wherein the crystal resonator is a dual-mode resonator, wherein the crystal resonator, the first crystal cap and the second crystal cap have substantially identical crystal orientations and coefficients of thermal expansion;

a vacuum chamber, the clock disposed inside the vacuum chamber in a second vacuum to provide a time reference for dynamic calibration using an analytical thermal stress model; and a first electrode and a second electrode, a first portion of the first electrode substantially ring-shaped and disposed on a first circumferential surface of the first cap, a second portion of the second electrode substantially ring-shaped and disposed on a second circumferential surface of the second cap, wherein the first electrode and the second electrode are cylindrically shaped and symmetric relative to a longitudinal axis of the clock for enabling heat propagation paths through the first electrode and the second electrode.

6. The apparatus of claim 5 further comprising a thermal insulating support, wherein the first crystal cap, the second crystal cap and the crystal resonator are coupled to the vacuum chamber via the support.

7. The apparatus of claim 5 wherein the first crystal cap, the second crystal cap and the crystal resonator are composed of quartz.

8. The apparatus of claim 5 wherein the first crystal cap is substantially symmetric relative to the second crystal cap.

9. An apparatus, comprising:

a clock to be disposed in a first vacuum of a vacuum chamber, the clock comprising a first quartz layer, a second quartz layer and a third quartz layer, wherein the second quartz layer is a dual-mode resonator, wherein a portion of the second quartz layer is disposed in a second vacuum between the first quartz layer and the third quartz layer, wherein a frequency of resonance of the second quartz layer is to provide a time reference for dynamic calibration using an analytical thermal stress model, and wherein the first quartz layer, the second quartz layer and the third quartz layer have substantially identical crystal orientations; and a first electrode and a second electrode, a first portion of the first electrode substantially ring-shaped and disposed on a first circumferential surface of the first quartz layer, a second portion of the second electrode substantially ring-shaped and disposed on a second circumferential surface of the second quartz layer, wherein the first electrode and the second electrode are cylindrically shaped and symmetric relative to a longitudinal axis of the clock for enabling heat propagation paths through the first electrode and the second electrode.

* * * * *